(12) United States Patent
Park (10) Patent No.: US 9,368,167 B2
(45) Date of Patent: Jun. 14, 2016

(54) SEMICONDUCTOR APPARATUS AND TESTING METHOD THEREOF

(71) Applicant: SK hynix Inc., Icheon-si Gyeonggi-do (KR)

(72) Inventor: Heat Bit Park, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 194 days.

(21) Appl. No.: 14/188,911

(22) Filed: Feb. 25, 2014

(65) Prior Publication Data

US 2015/0115268 A1    Apr. 30, 2015

(30) Foreign Application Priority Data

Oct. 24, 2013   (KR) .................. 10-2013-0127194

(51) Int. Cl.
*G11C 7/10* (2006.01)
*H01L 25/065* (2006.01)
*G11C 29/02* (2006.01)
*H01L 23/00* (2006.01)

(52) U.S. Cl.
CPC ............... *G11C 7/10* (2013.01); *G11C 29/022* (2013.01); *H01L 25/0657* (2013.01); *G11C 7/1048* (2013.01); *G11C 7/1096* (2013.01); *H01L 24/13* (2013.01); *H01L 24/16* (2013.01); *H01L 24/17* (2013.01); *H01L 2224/13025* (2013.01); *H01L 2224/16146* (2013.01); *H01L 2224/17181* (2013.01)

(58) Field of Classification Search
CPC ...... G11C 29/022; G11C 7/10; G11C 7/1048; G11C 7/1096; G11C 29/006
See application file for complete search history.

(56) References Cited

U.S. PATENT DOCUMENTS

| 5,539,702 A * | 7/1996 | Ahn | G11C 29/38 365/189.05 |
| 2001/0015924 A1* | 8/2001 | Arimoto | G01R 31/3172 365/201 |
| 2005/0046002 A1* | 3/2005 | Lee | H01L 21/76898 257/678 |
| 2010/0332177 A1* | 12/2010 | Wu | G01R 31/318558 702/117 |
| 2011/0187408 A1* | 8/2011 | Byeon | H03K 19/173 326/37 |
| 2013/0121092 A1* | 5/2013 | Ogasawara | G11C 7/00 365/189.15 |

FOREIGN PATENT DOCUMENTS

KR    1020120062281 A    6/2012

OTHER PUBLICATIONS

M. Puech, Fabrication of 3D Packaging TSV using DRIE, Apr. 2008, EDA Publishing/DTIP. http://arxiv.org/ftp/arxiv/papers/0805/0805.0919.pdf accessed by Nov. 1, 2015.*

* cited by examiner

*Primary Examiner* — Vanthu Nguyen
*Assistant Examiner* — Khamdan Alrobaie
(74) *Attorney, Agent, or Firm* — William Park & Associates Ltd.

(57) ABSTRACT

A semiconductor apparatus having a through via to be electrically coupled with a chip includes a latch memory cell configured to be electrically coupled with the through via and receive a signal transmitted through the through via, and output a stored signal to the through via.

19 Claims, 5 Drawing Sheets

SEMICONDUCTOR APPARATUS AND TESTING METHOD THEREOF

CROSS-REFERENCES TO RELATED APPLICATION

The present application claims priority under 35 U.S.C. §119(a) to Korean application number 10-2013-0127194, filed on Oct. 24, 2013, in the Korean Intellectual Property Office, which is incorporated herein by reference in its entirety.

BACKGROUND

1. Technical Field

Various embodiments relate to a semiconductor apparatus, and more particularly, to a semiconductor apparatus which does not have memory cells, and a testing method thereof.

2. Related Art

In order to improve the degree of integration of a semiconductor apparatus, a 3D (three-dimensional) semiconductor apparatus, in which a plurality of chips are stacked and packaged in a single package, has been developed. Recently, a TSV (through-silicon via) type semiconductor apparatus has been disclosed in the art, in which through-silicon vias are formed to pass through a plurality of stacked chips such that all the memory chips are electrically coupled with one another.

Exemplifying memory apparatuses, two types of 3D semiconductor apparatuses may be configured. A first is a type in which a plurality of memory chips having substantially the same structure are stacked, and a second is a type in which at least two core chips each having a memory cell array and at least one base chip having no memory cell array are stacked.

Since the core chips have memory cells, the test of the core chips may be performed by storing data in the core chips or outputting stored data, through test equipment. However, since the base chip does not have a memory cell array, the reliability of the base chip may not be tested through input and output of data. Therefore, in the conventional art, the reliability of the base chip cannot help but be tested by performing a test for the entire 3D semiconductor apparatus after the base chip is stacked and packaged along with the core chips.

SUMMARY

A semiconductor apparatus, in which a latch memory cell is formed to be electrically coupled with a through via provided to be electrically coupled with another chip, thereby allowing a chip to be tested even though the chip does not have a memory cell array, and a testing method thereof are described herein.

In an embodiment of the present disclosure, a semiconductor apparatus having a through via to be electrically coupled with a chip includes: a latch memory cell configured to be electrically coupled with the through via and receive a signal transmitted through the through via, and output a stored signal to the through via.

In an embodiment of the present disclosure, a semiconductor apparatus includes: a base chip including a latch memory cell electrically coupled with a through via, wherein the latch memory cell is electrically coupled with the through via at a specified time when the base chip is not stacked with another chip, and continuously electrically coupled with the through via when the base chip is stacked with the another chip.

In an embodiment of the present invention, a system to comprises: a processor; a controller configured to receive a request and a data from the processor; and a memory unit configured to receive the request and the data from the controller, wherein the memory unit comprises: a latch memory cell configured to be electrically coupled to the through via and receive a signal transmitted through the through via and output a stored signal to the through via.

BRIEF DESCRIPTION OF THE DRAWINGS

Features, aspects, and embodiments are described in conjunction with the attached drawings, in which.

DETAILED DESCRIPTION

Hereinafter, a semiconductor apparatus and a testing method thereof according to the present disclosure will be described below with reference to the accompanying drawings through various embodiments.

Figure 1:
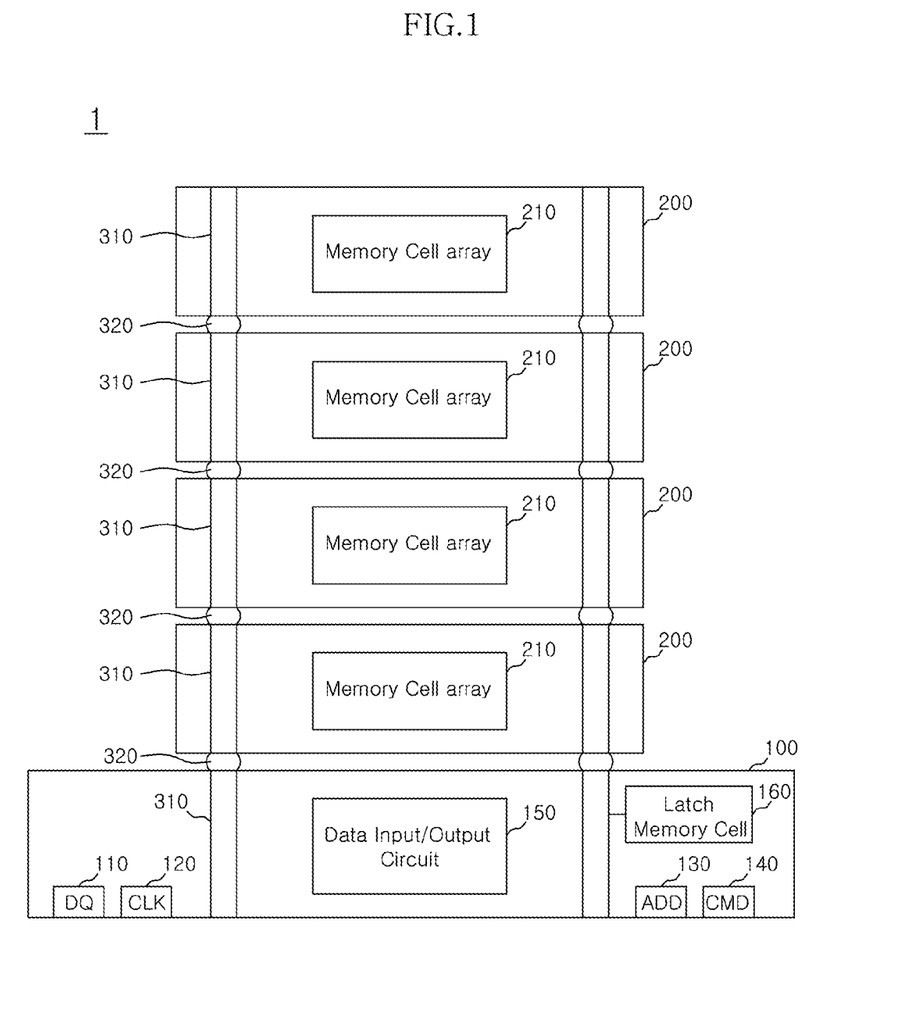
FIG. 1 is a diagram showing the configuration of a 3D semiconductor apparatus in accordance with an embodiment of the present disclosure.

In FIG. 1, a 3D semiconductor apparatus 1 includes a base chip 100 which is positioned lowermost and a plurality of core chips 200 which are sequentially stacked on the base chip 100. The base chip 100 may be a logic chip, a memory controller or a processor. The base chip 100 may relay the communication between an external device such as a host or test equipment and the core chips 200. The base chip 100 may control the operations of the plurality of core chips 200 according to a request from the external device. The base chip 100 does not have a memory cell array for storing data.

Each of the plurality of core chips 200 may be a memory chip and may be controlled by the base chip 100. The core chips 200 have memory cell arrays 210 for storing data. The core chips 200 may store the data received from the base chip 100, in the memory cell arrays 210, and may output the data stored in the memory cell arrays 210, to the base chip 100.

The base chip 100 and the plurality of core chips 200 may be stacked upon one another and may form various types of semiconductor apparatuses. Without a limiting sense, the 3D semiconductor apparatus 1 may be a system-on-chip, a system-in-package, a multi-chip package, or a package-on-package. In FIG. 1, the base chip 100 and the plurality of core chips 200 may be electrically coupled with one another through a plurality of through vias 310. The through vias 310 may be electrodes which are formed through the base chip 100 and the core chips 200, and may form signal paths which transmit signals from the base chip 100 to the core chips 200 or from the core chips 200 to the base chip 100. The through vias 310 which are formed in the respective chips 100 and 200 may be electrically coupled with one another through bumps 320 which are disposed between the respective chips 100 and 200.

The base chip 100 may include a data buffer (DQ) 110, a clock buffer (CLK) 120, an address buffer (ADD) 130, a command buffer (CMD) 140, and a data input/output circuit 150. The data buffer 110 may be a data pad, and may receive data from the external device or output data to the external device. The clock buffer 120 may receive a clock signal from the external device. In an embodiment, the clock buffer 120 may directly generate a clock signal which is to be used in the operations of the 3D semiconductor apparatus 1. The address buffer 130 may receive an address signal from the external device, and the command buffer 140 may receive a command signal from the external device. The data input/output circuit 150 performs a function of converting the data inputted from the external device, into data appropriate to be stored in the core chips 200. The base chip 100 has a number of logic circuits to store data to the core chips 200 or output the data outputted from the core chips 200, to the external device, as described above. However, since the base chip 100 does not have a memory cell array, it is difficult to test the base chip 100, unlike the core chips 200 capable of storing data. While the test of the base chip 100 may be performed after the base chip 100 is stacked along with the core chips 200, if it is found after stacking that a fail exists in the base chip 100, the entire 3D semiconductor apparatus 1 formed through stacking may be sorted as a bad product, which may serve as a factor that increases the manufacturing cost of a semiconductor apparatus. In consideration of this fact, the semiconductor apparatus 1 in accordance with an embodiment of the present disclosure may include a latch memory cell 160 which is electrically coupled with the through via 310. The latch memory cell 160 may be formed in a chip which does not have a memory cell array, like the base chip 100.

The latch memory cell 160 allows the test of the operation and reliability of the base chip 100 to be performed when the base chip 100 exists as a single chip at a wafer level. The latch memory cell 160 may store the data received by the base chip 100 and output stored data, similarly to a general memory cell array.

Figure 2:
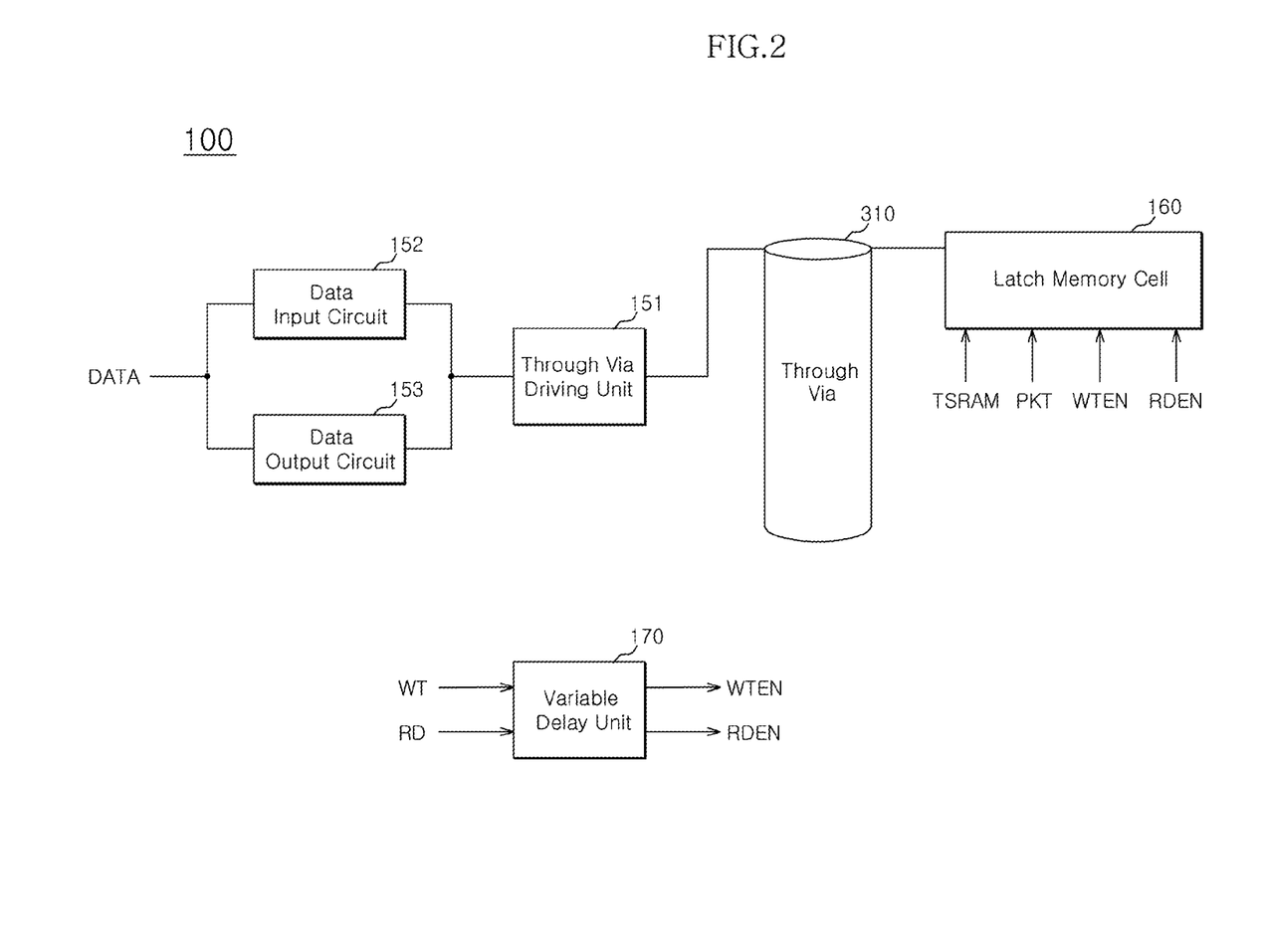
FIG. 2 is a diagram showing in detail the configuration of an embodiment of a base chip.

FIG. 2 is a diagram showing in detail the configuration of an embodiment of the base chip 100. In FIG. 2, the base chip 100 may include the through via 310 and the latch memory cell 160. The through via 310 may allow the base chip 100 to be stacked along with another chip, for example, the core chip 200, and may serve as a signal path between the base chip 100 and another chip. The latch memory cell 160 may be electrically coupled with the through via 310. The latch memory cell 160 may be electrically coupled with the through via 310 at a specified time before the base chip 100 is stacked with another chip. Also, the latch memory cell 160 may be continuously electrically coupled with the through via 310 after the base chip 100 is stacked with another chip.

The latch memory cell 160 may receive a wafer test signal TSRAM, a stack enable signal PKT, a write enable signal WTEN, and a read enable signal RDEN. The wafer test signal TSRAM is a signal which may be inputted when the base chip 100 is not stacked with another chip, and the stack enable signal PKT is a signal which may be inputted after the base chip 100 is stacked with another chip. The wafer test signal TSRAM and the stack enable signal PKT may be generated by the base chip 100 itself through detecting whether the base chip 100 is stacked or not, or may be received from the external device such as a host device or test equipment. The write enable signal WTEN may be generated on the basis of a write command WT. The write command WT is a command signal which may be received through the command buffer 140 from the external device, and may be inputted to store data in the semiconductor apparatus 1. The read enable signal RDEN may be generated on the basis of a read command RD. The read command RD is a command signal which may be received through the command buffer 140 from the external device, similarly to the write command WT, and may be inputted to output the data stored in the semiconductor apparatus 1. The latch memory cell 160 may be electrically coupled with the through via 310 at only a specified time in response to the write enable signal WTEN and the read enable signal RDEN when the wafer test signal TSRAM is inputted. Accordingly, the latch memory cell 160 may perform the function of a general memory cell which may store the data inputted from the external device in a write operation and may output stored data in a read operation. The latch memory cell may be configured to be electrically coupled with the through via 310, receive a signal transmitted through the through via 310 when the wafer test signal TSRAM and the write enable signal WTEN are enabled and output the stored signal to the through via 310 when the wafer test signal TSRAM and the read enable signal RDEN are enabled. The latch memory cell 160 may be continuously electrically coupled with the through via 310 when the stack enable signal PKT is inputted.

In FIG. 2, the base chip 100 may further include a through via driving unit 151, a data input circuit 152, and a data output circuit 153. The through via driving unit 151, the data input circuit 152 and the data output circuit 153 may be the component elements of the data input/output circuit 150 of FIG. 1. The through via driving unit 151 may drive a signal which is transmitted through the through via 310. The through via driving unit 151 may include any circuit configuration which allows signal transmission through the through via 310 to be smoothly implemented in conformity with the characteristic of the through via 310.

The data input circuit 152 may convert data DATA inputted from the external device, into data appropriate to be stored in the semiconductor apparatus 1. The data input circuit 152 may convert the data DATA inputted in series, into parallel data, and may provide the converted data to the through via driving unit 151. The through via driving unit 151 drives the through via 310 according to the converted data such that the converted data may be transmitted through the through via 310. The data input circuit 152 may include circuits associated with a data storage operation, for example, circuit configurations such as a data input buffer, a data alignment unit, and so forth.

The data output circuit 153 may convert the data stored in the semiconductor apparatus 1, into data appropriate to be outputted to the external device. The data output circuit 153 may convert the parallel data transmitted through the through via 310, into serial data, provide the serial data as the data, and may output the converted data DATA. The data output circuit 153 may receive data which is transmitted through the through via 310 and is driven by the through via driving unit 151, and may generate the data DATA. The data output circuit 153 may include circuits associated with a data output operation, for example, circuit configurations such as a pipe latch circuit, a data output buffer, and so forth. The input terminal of the data input circuit 152 for receiving the data DATA and the output terminal of the data output circuit 153 for outputting the data DATA may be commonly electrically coupled with the data buffer 110 shown in FIG. 1.

In FIG. 2, the base chip 100 may further include a variable delay unit 170. The variable delay unit 170 may receive the write to command WT and the read command RD and generate the write enable signal WTEN and the read enable signal RDEN. The variable delay unit 170 may delay the write command WT and the read command RD and generate the write enable signal WTEN and the read enable signal RDEN in the form of pulses. A time by which the variable delay unit 170 delays the write command WT may be a time that is acquired by modeling a time from when the write command WT is inputted to the semiconductor apparatus 1 and to when data is actually transmitted to the core chip 200 through the through via 310. Further, a time by which the variable delay unit 170 delays the read command RD may be a time that is acquired by modeling a time from when the read command RD is inputted to the semiconductor apparatus 1 to when the data stored in the core chip 200 is actually transmitted to the through via 310.

Figure 3:
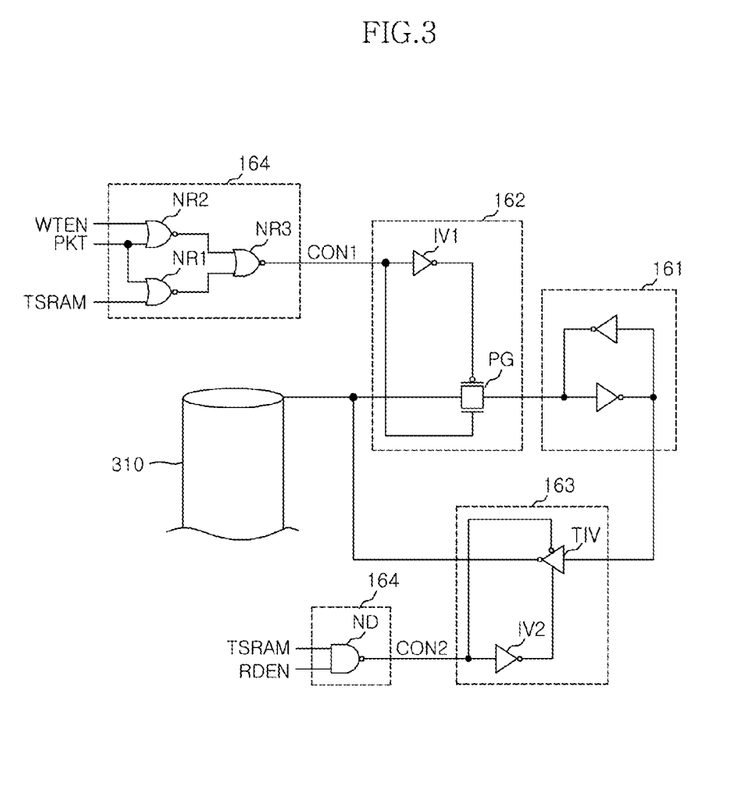
FIG. 3 is a diagram showing the detailed configurations of a through via and a latch memory cell

FIG. 3 is a diagram showing the detailed configurations of the through via 310 and the latch memory cell 160. In FIG. 3, the latch memory cell 160 includes a latch unit 161, an input gate 162, an output gate 163, and a control signal generation unit 164. The latch unit 161 may latch the signal or data transmitted through the through via 310. The input gate 162 may electrically couple the latch unit 161 and the through via 310 in response to a first control signal CON1. The output gate 163 may electrically couple the latch unit 161 and the through via 310 in response to a second control signal CON2.

The control signal generation unit 164 may generate the first control signal CON1 and the second control signal CON2 on the basis of the wafer test signal TSRAM, the stack enable signal PKT, the write enable signal WTEN and the read enable signal RDEN. The control signal generation unit 164 may enable the first control signal CON1 in response to the write enable signal WTEN, when the stack enable signal PKT is disabled and the wafer test signal TSRAM is enabled. Also, the control signal generation unit 164 may generate the second control signal CON2 in response to the read enable signal RDEN, when the wafer test signal TSRAM is enabled. The control signal generation unit 164 may enable the first control signal CON1 regardless of the wafer test signal TSRAM and the write enable signal WTEN, when the stack enable signal PKT is enabled. The latch memory cell 160 may latch the signal transmitted through the through via 310 when the stack enable signal PKT is enabled.

In FIG. 3, the input gate 162 may include a first inverter IV1 and a pass gate PG. The first inverter IV1 inverts the first control signal CON1. The pass gate PG receives the first control signal CON1 and the inverted signal of the first control signal CON1, and may electrically couple the through via 310 and the latch unit 161. The output gate 163 may include a second inverter IV2 and a tri-state inverter TIV. The second inverter IV2 inverts the second control signal CON2. The tri-state inverter TIV may drive the output of the latch unit 161 in response to the second control signal CON2 and the inverted signal of the second control signal CON2, and may output the output of the latch unit 161 to the through via 310. In FIG. 3, it is exemplified that the input gate 162 includes the pass gate PG since it is sufficient for the input gate 162 to receive the signal transmitted through the through via 310 and that the output gate 163 includes the tri-state inverter TIV since the output gate 163 should drive the through via 310 according to the signal stored in the latch unit 161.

The control signal generation unit 164 may include first to third NOR gates NR1 to NR3 and a NAND gate ND. The first NOR gate NR1 may receive the wafer test signal TSRAM and the stack enable signal PKT. The second NOR gate NR2 may receive the stack enable signal PKT and the write enable signal WTEN. The third NOR gate NR3 may receive the outputs of the first and second NOR gates NR1 and NR2 and may generate the first control signal CON1. Accordingly, the first to third NOR gates NR1 to NR3 may enable the first control signal CON1 to a high level in response to the write enable signal WTEN which is enabled to a high level, when the stack enable signal PKT is disabled to a low level and the wafer test signal TSRAM is enabled to a high level. Also, the first to third NOR gates NR1 to NR3 may enable the first control signal CON1 to the high level regardless of the wafer test signal TSRAM and the write enable signal WTEN, when the stack enable signal PKT is enabled to a high level.

The NAND gate ND may receive the wafer test signal TSRAM and the read enable signal RDEN and may generate the second control signal CON2. The NAND gate ND may generate the second control signal CON2 which is enabled to a low level, in response to the read enable signal RDEN which is enabled to a high level, when the wafer test signal TSRAM is enabled to the high level. The NAND to gate ND may disable the second control signal CON2 when even any one of the wafer test signal TSRAM and the read enable signal RDEN is disabled to a low level.

Operations of the semiconductor apparatus 1 in accordance with an embodiment of the present disclosure will be described below with reference to FIGS. 1 to 3. When the base chip 100 is not stacked along with the core chips 200, the stack enable signal PKT is disabled and the wafer test signal TSRAM is enabled. If the base chip 100 receives the write command WT and the data DATA from the external device, the variable delay unit 170 delays the write command WT and generates the write enable signal WTEN, and the data DATA may be transmitted to the through via 310 through the data input circuit 152 and the through via driving unit 151. The input gate 162 may electrically couple the through via 310 and the latch unit 161 in response to the first control signal CON1 which is enabled on the basis of the write enable signal WTEN. Accordingly, the latch unit 161 may receive and store the data transmitted through the through via 310 while the first control signal CON1 is enabled.

Thereafter, if the base chip 100 receives the read command RD, the variable delay unit 170 may delay the read command RD and may generate the read enable signal RDEN. The output gate 163 may electrically couple the through via 310 and the latch unit 161 in response to the second control signal CON2 which is enabled on the basis of the read enable signal RDEN, and the data stored in the latch unit 161 may be transmitted to the through via 310. The data transmitted to the through via 310 may be outputted to the external device through the through via driving unit 151 and the data output circuit 153. Accordingly, the external device may test whether or not the internal circuits of the base chip 100 operate normally, by comparing the level of the data DATA provided to the base chip 100 together with the write command WT and the level of the data DATA outputted from the base chip 100 according to the read command RD.

If the base chip 100 is stacked along with another chip, the wafer test signal TSRAM is disabled and the stack enable signal PKT is enabled. If the stack enable signal PKT is enabled, the first control signal CON1 may be enabled and retain its state, and the second control signal CON2 may be disabled. Accordingly, the latch unit 161 may be continuously electrically coupled with the through via 310 through the input gate 162. The latch unit 161 may latch and drive the signal transmitted through the through via 310, and may facilitate smooth signal transmission through the through via 310 between the base chip 100 and the core chips 200.

Figure 4:
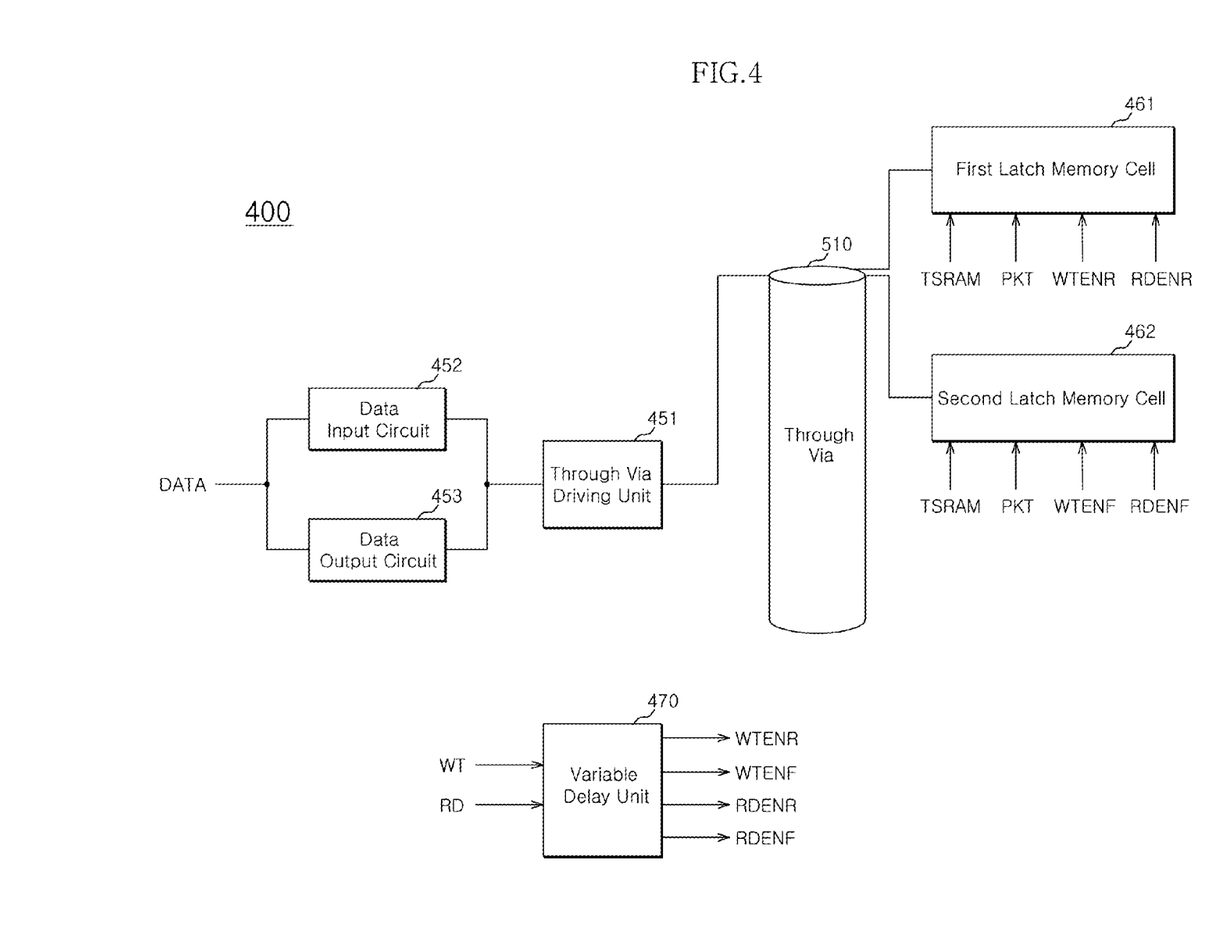
FIG. 4 is a diagram showing in detail the configuration of an embodiment of a base chip.

FIG. 4 is a diagram showing in detail the configuration of an embodiment of a base chip 400. In FIG. 4, the base chip 400 may include a through via driving unit 451, a data input circuit 452 and a data output circuit 453, similarly to the base chip 100 shown in FIG. 1. In addition, the base chip 400 may include first and second latch memory cells 461 and 462 which are commonly electrically coupled with a through via 510. Also, the base chip 400 may further include a variable delay unit 470. The variable delay unit 470 may generate first and second write enable signals WTENR and WTENF in response to a write command WT, and may generate first and second read enable signals RDENR and RDENF in response to a read command RD. The first write enable signal WTENR and the first read enable signal RDENR may be generated in synchronization with the rising edge of a clock signal, and the second write enable signal WTENF and the second read enable signal RDENF may be generated in synchronization with the falling edge of the clock signal.

The first latch memory cell 461 may be electrically coupled with the through via 510 in response to the first write enable signal WTENR and the first read enable signal RDENR, and the second latch memory cell 462 may be electrically coupled with the through via 510 in response to the second write enable signal WTENF and the second read enable signal RDENF. The first latch memory cell 461 and second latch memory cell 42 also receive a wafer test signal TSRAM and a stack enable signal PKT. The first and second latch memory cells 461 and 462 may be provided to support that the semiconductor apparatus 1 operates in a DDR (double data rate) mode in which it receives or outputs two data DATA at a time in synchronization with the rising edge and the falling edge of the clock signal. The variable delay unit 470 may generate two write enable signals and two read enable signals in response to the write command WT and the read command RD, such that, when two data are sequentially transmitted through the through via 510, the two data may be sequentially stored in and outputted from the first and second latch memory cells 461 and 462.

Figure 5:
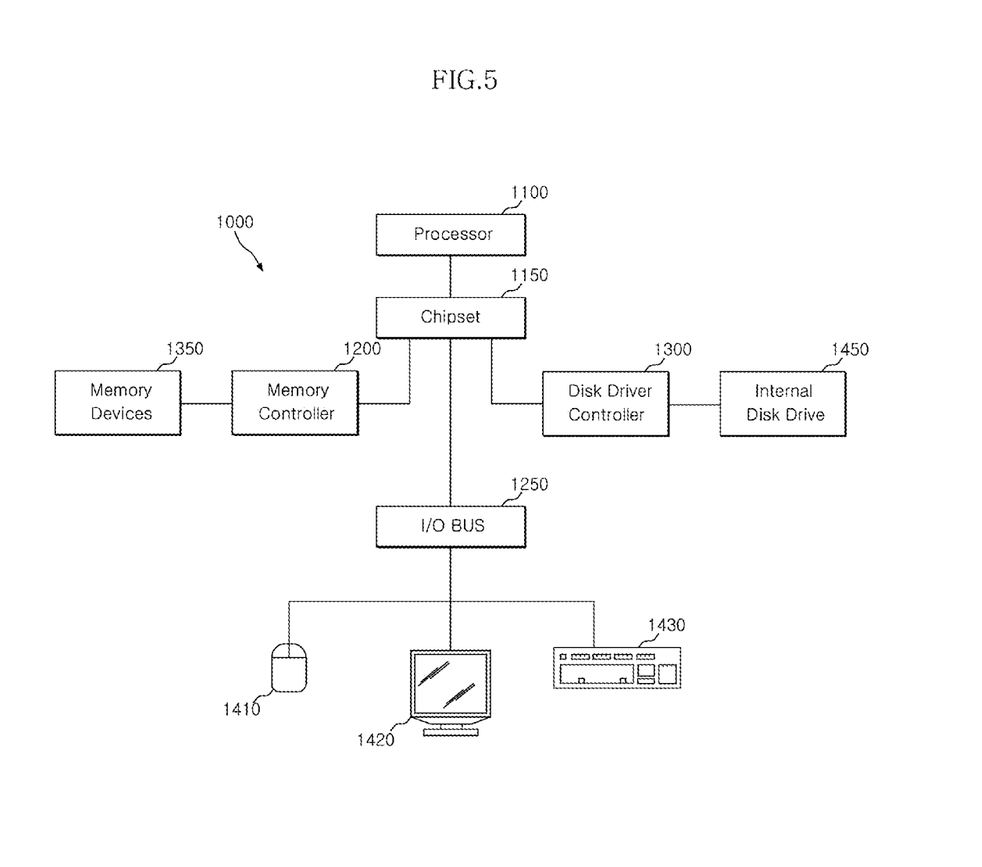
FIG. 5 illustrates a block diagram of a system employing a memory controller circuit in accordance with an embodiment of the present invention.

Referring to FIG. 5, a system 1000 may include one or more processors 1100 that may be used individually or in combination with other processors. A chipset 1150 may be operably coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be operably coupled to the chipset 1150. The memory controller 1200 can receive a request provided from the processor 1100 through the chipset 1150. The memory controller 1200 may be operably coupled to one or more memory devices 1350. The memory devices 1350 may correspond to the semiconductor apparatus 1 described above.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be operably coupled to the chipset 1150. The disk drive controller 1300 may serve as the communication pathway between the chipset 1150 and one or more internal disk drives 1450. The internal disk drive 1450 and disk drive controller 1300 may communicate with each other or with the chipset 1150 using virtually any type of communication protocol, including all of those mentioned above with regard to the I/O bus 1250.

While certain embodiments have been described above, it will be understood to those skilled in the art that the embodiments described are by way of example only. Accordingly, the semiconductor apparatus and the testing method thereof described herein should not be limited based on the described embodiments. Rather, the semiconductor apparatus and the testing method thereof described herein should only be limited in light of the claims that follow when taken in conjunction with the above description and accompanying drawings.

What is claimed is:

1. A semiconductor apparatus having a through via to be electrically coupled with a chip, comprising:
    a latch memory cell configured to be electrically coupled with the through via and receive a signal transmitted through the through via when a wafer test signal and a write enable signal are enabled, to output a stored signal to the through via when the wafer test signal and a read enable signal are enabled, and to be continuously coupled with the through via and latch the signal transmitted through the through via when a stack enable signal is enabled;
    wherein the latch memory cell is located in the base chip, and the base chip does not have a memory cell array for storing data;
    wherein the wafer test signal is enabled and the stack enable signal is disable when the base chip is not stacked with another chip, and the wafer test signal is disable and the stacked enable signal is enabled when the base chip is stacked with another chip.

2. The semiconductor apparatus according to claim 1, wherein the latch memory cell comprises:
    a latch unit;
    an input gate configured to electrically couple the through via and the latch unit in response to a first control signal;
    an output gate configured to electrically couple the through via and the latch unit in response to a second control signal; and
    a control signal generation unit configured to generate the first and second control signals in response to the wafer test signal, the stack enable signal, the write enable signal and the read enable signal.

3. The semiconductor apparatus according to claim 2, wherein the control signal generation unit enables the first control signal in response to the write enable signal and enables the second control signal in response to the read enable signal, when the stack enable signal is disabled and the wafer test signal is enabled.

4. The semiconductor apparatus according to claim 3, wherein the control signal generation unit enables the first control signal regardless of the wafer test signal and the write enable signal when the stack enable signal is enabled.

5. The semiconductor apparatus according to claim 1, further comprising:
    a through via driving unit configured to drive the signal transmitted through the through via;
    a data input circuit configured to provide data to the through via driving unit; and
    a data output circuit configured to generate the data from a signal outputted from the through via driving unit.

6. The semiconductor apparatus according to claim 5, wherein an input terminal of the data input circuit and an output terminal of the data output circuit are commonly electrically coupled with a data buffer.

7. The semiconductor apparatus according to claim 5, wherein the data input circuit converts the data serially inputted, into parallel data, and provides the parallel data to the through via driving unit, and the data output circuit converts the signal outputted from the through via driving unit, into serial data, and provides the serial data as the data.

8. The semiconductor apparatus according to claim 1, further comprising:

a variable delay unit configured to variably delay a write command and generate the write enable signal, and variably delay a read command and generate the read enable signal.

9. A semiconductor apparatus comprising:
a base chip including a through via and a latch memory cell,
wherein the latch memory cell is electrically coupled with the through via at a specified time in response to a write enable signal and a read enable signal when the base chip is not stacked with another chip, and continuously electrically coupled with the through via when the base chip is stacked with the another chip;
wherein the base chip does not have a memory cell array for storing data;
wherein the wafer test signal is enabled and the stack enable signal is disable when the base chip is not stacked with another chip, and the wafer test signal is disable and the stacked enable signal is enabled when the base chip is stacked with another chip.

10. The semiconductor apparatus according to claim 9, wherein the latch memory cell stores data transmitted through the through via in response to the write enable signal and outputs stored data to the through via in response to the read enable signal, when the base chip is not stacked with another chip.

11. The semiconductor apparatus according to claim 9, wherein the latch memory cell comprises:
a latch unit;
an input gate configured to electrically couple the through via and the latch unit in response to a first control signal;
an output gate configured to electrically couple the through via and the latch unit in response to a second control signal; and
a control signal generation unit configured to generate the first and second control signals in response to a wafer test signal, a stack enable signal, the write enable signal and the read enable signal.

12. The semiconductor apparatus according to claim 11, wherein the control signal generation unit enables the first control signal in response to the write enable signal and enables the second control signal in response to the read enable signal, when the stack enable signal is disabled and the wafer test signal is enabled.

13. The semiconductor apparatus according to claim 12, wherein the control signal generation unit enables the first control signal regardless of the wafer test signal and the write enable signal when the stack enable signal is enabled.

14. The semiconductor apparatus according to claim 11, wherein the latch memory cell is configured to be continuously electrically coupled to the through via in response to the stack enable signal.

15. The semiconductor apparatus according to claim 11, wherein the latch unit is configured to receive and store data transmitted through the through via when the first control signal is enabled.

16. The semiconductor apparatus according to claim 9, further comprising:
a through via driving unit configured to drive the signal transmitted through the through via;
a data input circuit configured to provide inputted data to the through via driving unit; and
a data output circuit configured to generate the data from a signal outputted from the through via driving unit.

17. The semiconductor apparatus according to claim 16, wherein an input terminal of the data input circuit and an output terminal of the data output circuit are commonly electrically coupled with a data buffer.

18. The semiconductor apparatus according to claim 16, wherein the data input circuit converts the data serially inputted, into parallel data, and provides the parallel data to the through via driving unit, and the data output circuit converts the signal outputted from the through via driving unit, into serial data, and provides the serial data as the data.

19. The semiconductor apparatus according to claim 9, further comprising:
a variable delay unit configured to variably delay a write command and generate the write enable signal, and variably delay a read command and generate the read enable signal.

* * * * *